(12) United States Patent
Oh

(10) Patent No.: US 8,283,860 B2
(45) Date of Patent: Oct. 9, 2012

(54) ORGANIC LIGHT EMITTING DISPLAY DEVICE AND METHOD OF FABRICATING THE SAME

(75) Inventor: Sang-Hun Oh, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/049,786

(22) Filed: Mar. 16, 2011

(65) Prior Publication Data

US 2011/0165714 A1 Jul. 7, 2011

Related U.S. Application Data

(62) Division of application No. 11/302,871, filed on Dec. 13, 2005, now Pat. No. 7,928,653.

(30) Foreign Application Priority Data

Dec. 14, 2004 (KR) .................. 10-2004-0105909

(51) Int. Cl.
H01L 51/00 (2006.01)
H01L 51/50 (2006.01)
H01L 51/52 (2006.01)
H01L 51/56 (2006.01)

(52) U.S. Cl. ........ 313/506; 313/500; 313/505; 313/504; 445/24; 445/25

(58) Field of Classification Search .......... 313/498–512; 445/24–25; 315/169.1, 169.3; 428/690–691, 428/917; 438/26–29, 34, 82; 257/40, 72, 257/98–100, 642–643, 759; 427/66, 532–535, 427/539
See application file for complete search history.

(56) References Cited

U.S. PATENT DOCUMENTS

| | | | |
|---|---|---|---|
| 6,583,576 B2 | 6/2003 | Koyama | |
| 6,674,245 B2 | 1/2004 | Ko et al. | |
| 7,473,928 B1 | 1/2009 | Yamazaki et al. | |
| 2002/0140343 A1* | 10/2002 | Hirabayashi | 313/493 |
| 2003/0098645 A1 | 5/2003 | Lee et al. | |
| 2003/0137255 A1 | 7/2003 | Park et al. | |
| 2004/0056588 A1 | 3/2004 | Nozawa | |
| 2004/0135151 A1 | 7/2004 | Okamoto et al. | |
| 2005/0062407 A1 | 3/2005 | Suh et al. | |
| 2005/0116632 A1 | 6/2005 | Funamoto et al. | |
| 2006/0035064 A1* | 2/2006 | Hirai | 428/195.1 |
| 2006/0091396 A1 | 5/2006 | Lee et al. | |
| 2006/0202615 A1 | 9/2006 | Murakami et al. | |

* cited by examiner

Primary Examiner — Anne Hines
Assistant Examiner — Jose M Diaz
(74) Attorney, Agent, or Firm — Christie, Parker & Hale, LLP

(57) ABSTRACT

A method of fabricating an organic light emitting diode (OLED) display is provided. According to the method, a first electrode overlaps a scan line, a common power supply line and/or a data line. A pixel defining layer (PDL) is etched by backside exposure so that an aperture ratio of the OLED may be enhanced.

11 Claims, 5 Drawing Sheets

ORGANIC LIGHT EMITTING DISPLAY DEVICE AND METHOD OF FABRICATING THE SAME

CROSS-REFERENCE TO RELATED APPLICATION

This application is a divisional of U.S. patent application Ser. No. 11/302,871, filed Dec. 13, 2005, which claims priority to and the benefit of Korean Patent Application No. 10-2004-0105909, filed Dec. 14, 2004, the entire content of both of which is incorporated herein by reference.

BACKGROUND OF THE INVENTION

1. Field of the Invention

The present invention relates to a method of fabricating an organic light emitting diode (OLED) display, and more particularly, to a method of fabricating an OLED that has an enhanced aperture ratio by forming a first electrode to make it overlap with a scan line, a common power supply line Vdd and/or a data line Vdata and etching a pixel defining layer (PDL) by backside exposure.

2. Description of the Related Art

An OLED display is a flat panel display that is a self-emissive display, and has a wide viewing angle, a fast response speed, a thin thickness, a low fabrication cost, a high contrast ratio, and similar characteristics. In an OLED, holes and electrons are recombined in an emission layer to generate excitons so that light is emitted by energy generated from the excitons that are transitioned from an excited state to a ground state.

In general, OLED displays are classified into a passive matrix type and an active matrix type according to the manner of driving N×M pixels arranged in a matrix form. Passive matrix OLED displays have anode electrodes and a cathode electrodes perpendicular to each other and select a line to be driven, whereas the active matrix OLED displays allow a voltage to be maintained through the capacitance of a capacitor by connecting a thin film transistor and the capacitor to each pixel electrode in each pixel of a display region.

Each unit pixel basically has a switching transistor, a driving transistor, a capacitor, and an electroluminescent (EL) element in the active matrix OLED display. A common power supply voltage Vdd is supplied to the driving transistor and the capacitor from the power supply line, and the power supply line acts to control a current flowing toward the EL element through the driving transistor.

FIG. 1 is a plan view of a conventional active matrix OLED 140.

Referring to FIG. 1, the active matrix OLED 140 includes a scan line 10 for outputting a selection signal, and a data line 20 for outputting a data signal. In addition, it includes a common power supply line 30 arranged on the right and left sides of a pixel region to supply a power supply voltage, a switching transistor 40, a driving transistor 50, a capacitor 60, and an EL element (120). The driving transistor 50 includes a semiconductor layer 70, a gate electrode 80, and source and drain electrodes 90a and 90b, and contact holes 85 for connecting the source and drain electrodes 90a and 90b to the semiconductor layer 70, a via hole 95 for connecting one of the source and drain electrodes 90a and 90b to a first electrode 100, and a pixel defining layer 110 are disposed on the semiconductor layer 70. The pixel defining layer 110 defines an organic layer 120 and a pixel region and is formed on the entire surface of the substrate except a region where the organic layer 120 including at least an organic emission layer is formed.

In addition, a region where the organic layer 120 is formed on a portion of the first electrode 100 exposed by etching becomes an opening portion e, and in this case, an aperture ratio is defined as d1×d2.

The opening portion e of the conventional OLED has a first dimension d1 which is 41 μm and a second dimension d2 which is 134 μm, so that the aperture ratio becomes 5,494 μm² which is equal to 41 μm×134 μm.

Dead space d3 cannot be used as the opening portion on the pixel region, and is present on each of the right, left, and lower sides and has a width of 3 μm. Accordingly, dead space, which cannot be used as part of the opening portion, with a size of at least 9 μm is present in the unit pixel of the OLED.

FIG. 2 is a cross-sectional view taken along a line A-A' of FIG. 1 in the conventional active matrix OLED.

Referring to FIG. 2, the conventional active matrix OLED includes a substrate 62 having an opening region a, a transistor region b, and a metal line region c, and a buffer layer 66 is formed on the entire surface of the substrate 62. A semiconductor layer 70 including source and drain regions 70a and 70c and a channel region 70b is patterned on a predetermined region of the buffer layer 66 in the transistor region b. A gate insulating layer 67 is then formed on the entire surface of the semiconductor layer 70.

Subsequently, a gate electrode 80 corresponding to the channel region 70b of the semiconductor layer 70 is formed on the gate insulating layer 67 of the transistor region b. An interlayer-insulating layer 83 is formed on the entire surface of the gate electrode 80. The source and drain regions 70a and 70c of the semiconductor layer 70 are then connected to source and drain electrodes 90a and 90b via a contact hole 85 formed within the interlayer-insulating layer 83 of the transistor region b. Accordingly, a thin film transistor comprising the semiconductor layer 70, the gate electrode 80, and the source and drain electrodes 90a and 90b is formed. In this case, a data line 20 and a common power supply line 30 formed of the same material as the source and drain electrodes 90a and 90b are also formed on the interlayer-insulating layer 83 of the metal line region c at the time of forming the source and drain electrodes 90a and 90b of the transistor region b.

Subsequently, a passivation layer 91 is formed on the source and drain electrodes 90a and 90b, the data line 20, and the common power supply line 30. A via hole 95 exposing one of the source and drain electrodes 90a and 90b is formed on the passivation layer 91 of the transistor region b, and a first electrode 100 which is in contact with one of the source and drain electrodes 90a and 90b via the via hole 95 and extends onto the passivation layer 91 of the opening region a is formed. In this case, source and drain electrode materials forming the data line 20 and the common power supply line 30 do not overlap the first electrode 100.

Subsequently, a pixel defining layer (PDL) 110 having the opening portion e is formed on the first electrode 100 of the opening region a and the passivation layer 91 of the transistor region b and the metal line region c. Referring back to FIG. 1, the pixel defining layer 110 defines a pixel region and is formed on the entire surface of the substrate except the region where the organic layer 120 is formed.

Subsequently, an organic layer 120 including at least an organic emission layer is formed on the first electrode 100 exposed within the opening portion e, and a second electrode (not shown) is formed on the entire surface of the substrate including the organic layer 120.

However, the opening portion e for exposing the first electrode is formed by wet-etching the pixel defining layer which causes a limitation on opening an area on the first electrode due to isotropic etching, so that a dead space occurs on the pixel region, which in turn causes the opening to be narrow such that the aperture ratio decreases.

SUMMARY OF THE INVENTION

The embodiments of the present invention, therefore, provide a method of fabricating an organic light emitting diode (OLED) display and OLED with an enhanced aperture ratio by forming a first electrode to make it overlap at least one among a scan line, a common power supply line and a data line and etching a pixel defining layer (PDL) by backside exposure.

In an exemplary embodiment of the present invention, a method of fabricating an OLED and OLED display includes: providing a substrate; forming a thin film transistor including a semiconductor layer, a gate electrode, a source electrode and a drain electrode on a transistor region of a substrate; forming a scan line when forming the gate electrode on a metal line region of the substrate; forming a common power supply line and a data line when forming the source electrode and drain electrode; forming a passivation layer over an entire surface of the substrate including the thin film transistor; forming a first electrode to overlap at least one among the scan line, the common power supply line and/or the data line; forming a pixel defining layer on at least the first electrode, creating an opening portion in the pixel defining layer using a backside exposure technique to expose a portion of a surface of the first electrode; forming an organic layer including at least an organic emission layer on the exposed portion of the surface of the first electrode, and forming a second electrode on the organic layer.

In another exemplary embodiment of the present invention, an OLED and OLED display includes: a substrate, a thin film transistor formed on a transistor region of the substrate, the thin film transistor including a semiconductor layer, a gate electrode, a source electrode and a drain electrode; a scan line formed on the same layer when the gate electrode is formed in a metal line region of the substrate; a common power supply line and a data line formed on the same layer as the source electrode and drain electrode are formed; a first electrode overlapping the scan line, the common power supply line, and/or the data line; a pixel defining layer defining an opening portion, the pixel defining layer formed on the first electrode, the opening portion exposing a portion of a surface of the first electrode, the opening portion formed using a backside exposure; an organic layer formed on the exposed portion of first electrode and including at least an organic emission layer; and a second electrode formed on the organic layer.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

The present invention will now be described more fully hereinafter with reference to exemplary embodiments and the accompanying drawings.

Figure 1:
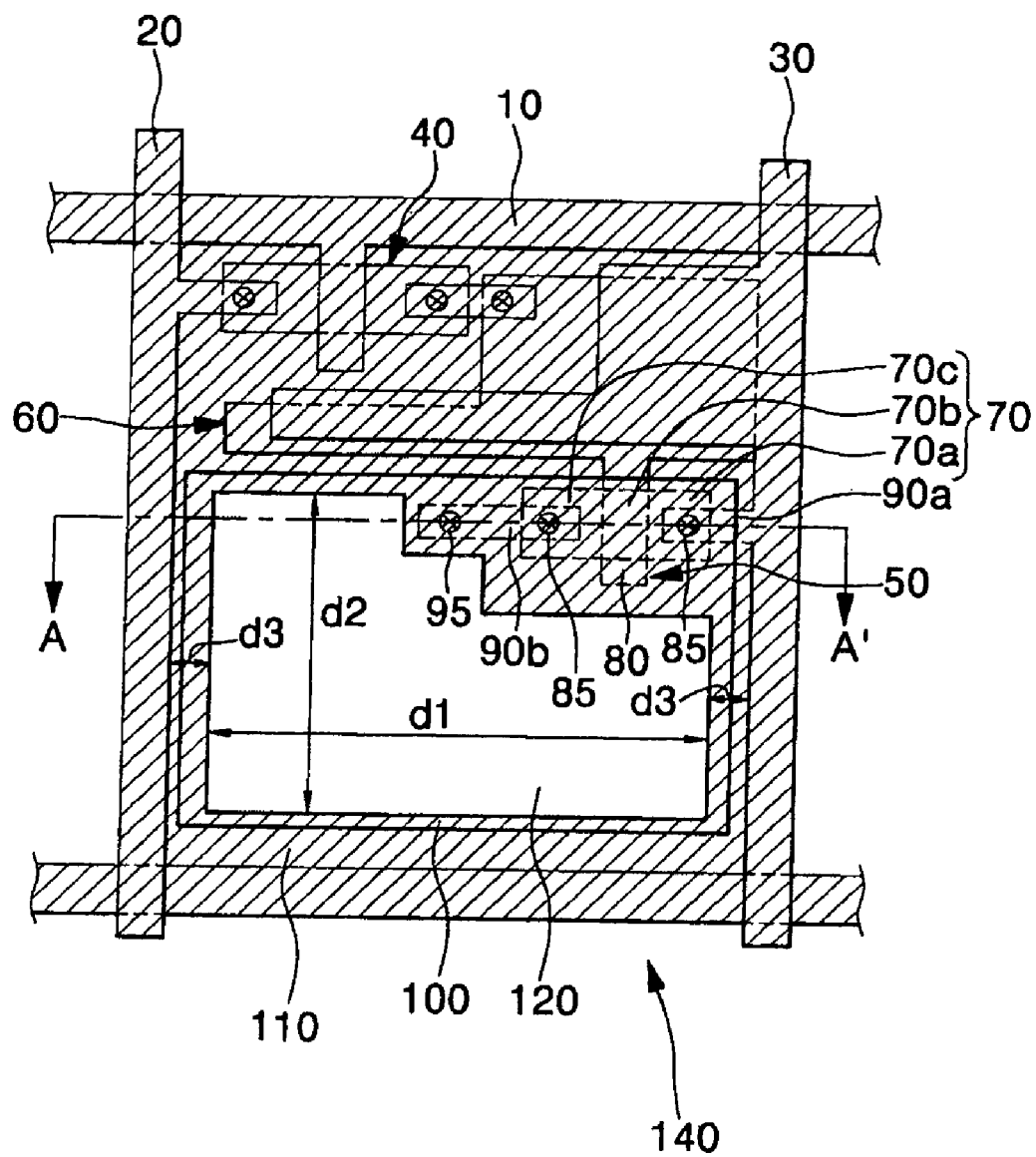
FIG. 1 is a plan view of a conventional active matrix OLED.
Figure 2:
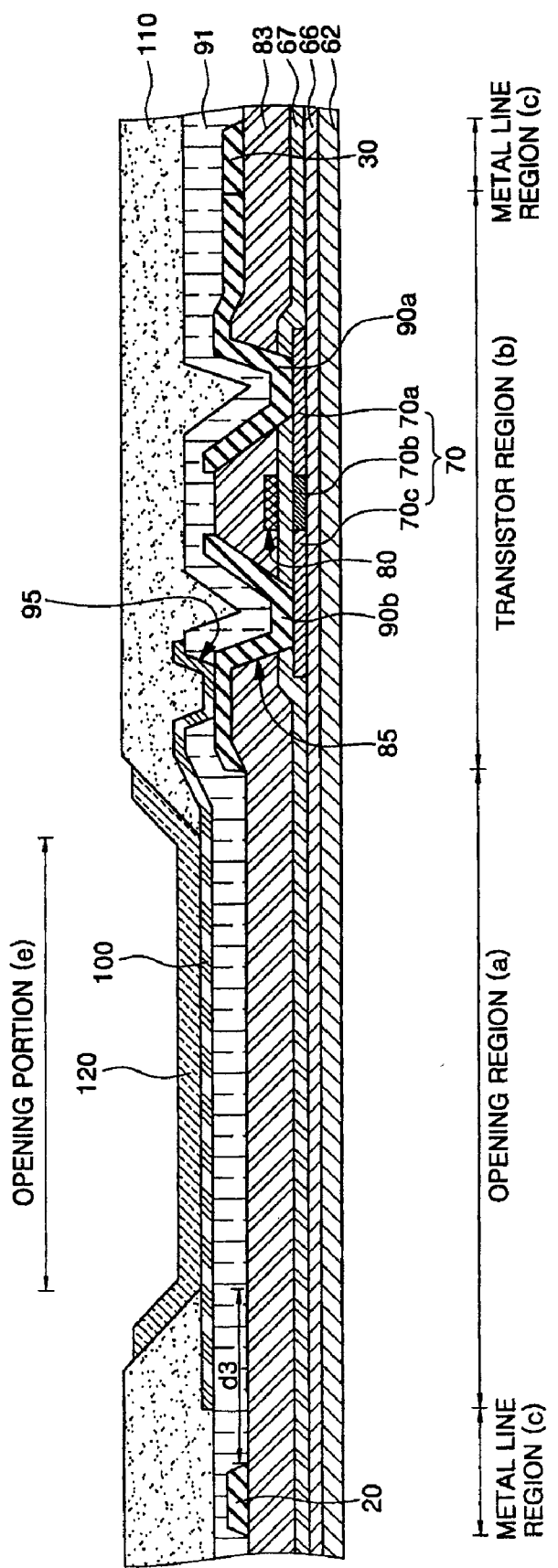
FIG. 2 is a cross-sectional view taken along a line A-A' of FIG. 1 in the conventional active matrix OLED.
Figure 3:
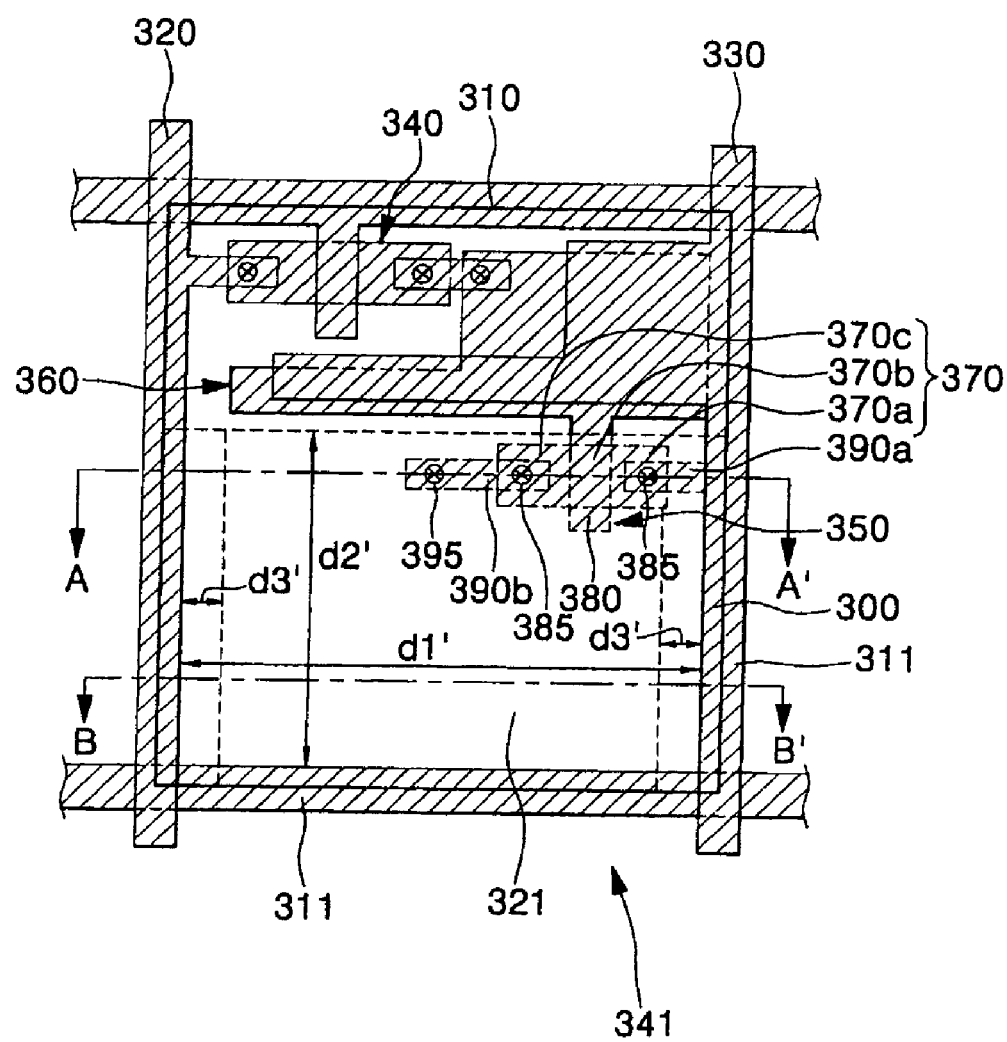
FIG. 3 is a plan view of an active matrix OLED in accordance with an exemplary embodiment of the present invention.

FIG. 3 is a plan view of an active matrix OLED in accordance with an exemplary embodiment of the present invention.

Referring to FIG. 3, an OLED display 341 includes a scan line 310 formed in a first direction and outputting a selection signal, and a data line 320 formed in a second direction perpendicular to the first direction and outputting a data signal. An active matrix OLED display includes a pixel region having a plurality of pixels, each pixel region being defined by the scan line 310 and the data line 320, and metal line regions (not shown) arranged above the pixel region and at outer portions of the right and left sides of the pixel region. In addition, an OLED display includes a common power supply line 330, a switching transistor 340, a driving transistor 350, a capacitor 360, and an electroluminescent (EL) element. The driving transistor 350 includes a semiconductor layer 370, a gate electrode 380, and source and drain electrodes 390a and 390b. A contact hole 385 for connecting the source and drain electrodes 390a and 390b to the semiconductor layer 370, a via hole 395 for connecting one of the source and drain electrodes 390a and 390b to a first electrode 300, an organic layer 321 including at least an organic emission layer, and a pixel defining layer 311 are disposed on the first electrode 300. The pixel defining layer 311 is formed above regions where the transistors 340 and 350, the capacitor 360, the scan line 310, the data line 320 and the common power supply line 330 are formed.

A region where the organic layer 321 is formed above a portion of the first electrode 300 exposed by the pixel defining layer 311 becomes an opening portion e', and in this case, an aperture ratio is defined as d1'×d2'.

When seen in a plan view of the OLED, d1' is 47 μm and d2' is 137 μm, so that the aperture ratio of the OLED becomes 6,439 μm² which is equal to 47 μm×137 μm. In more detail, d2' can be increase to greater than 137 μm by making the scan line 310 overlap the first electrode 300 and carrying out backside exposure on the pixel defining layer 311. In addition, by making the first electrode 300 overlap the scan line 310, the data line Vdata 320, and the common power supply line Vdd 330 and carrying out backside exposure on the pixel defining layer 311, the pixel defining layer 311 is etched except the regions where the transistors 340 and 350, the capacitor 360, the scan line 310, the data line 320, and the common power supply line 330 are formed, so that an emission region may extend to have an aperture ratio greater than 6,439 μm².

Figure 4:
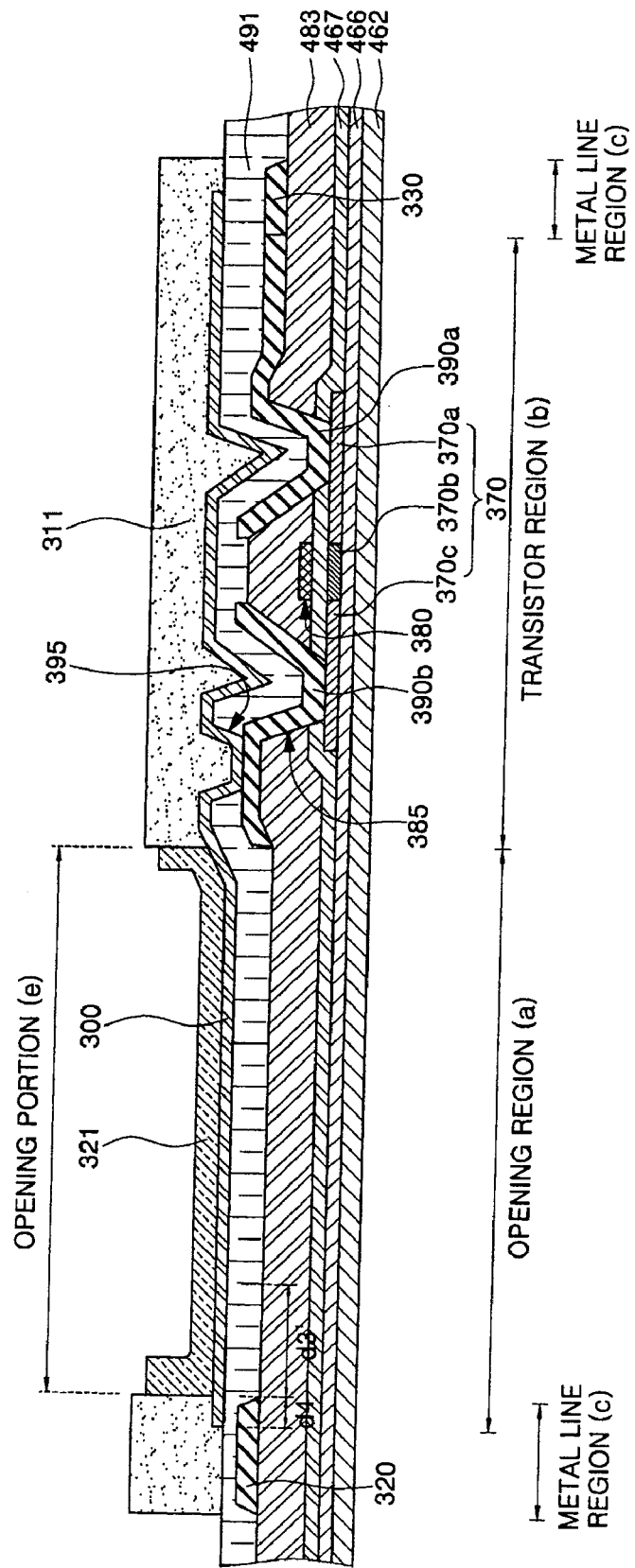
FIG. 4 is a cross-sectional view taken along a line B-B' of FIG. 3 in the active matrix OLED of the present invention.

FIG. 4 is a cross-sectional view taken along a line B-B' of FIG. 3 in the active matrix OLED of the present invention.

Referring to FIG. 4, the active matrix OLED according to the present invention includes a substrate 462 having an opening region a, a transistor region b, and a metal line region c. A buffer layer 466 may be further formed on the substrate 462. The buffer layer 466 acts to protect a thin film transistor to be formed in a subsequent process from impurities flowing out of the substrate. The buffer layer 466 is not necessarily formed, but may be formed of a silicon oxide layer, a silicon nitride layer, or a stacked layer thereof. The buffer layer 466 is stacked by a method such as a plasma enhanced chemical vapor deposition (PECVD) method and a low pressure CVD (LPCVD) method.

Subsequently, a semiconductor layer 370 including source and drain regions 370*a* and 370*c* and a channel region 370*b* is formed on the buffer layer 466. The semiconductor layer 370 may be formed of amorphous silicon or polycrystalline silicon, and is formed of polycrystalline silicon in the described embodiment. The semiconductor layer 370 is formed by a PECVD or LPCVD method.

The semiconductor layer 370 is formed by depositing amorphous silicon using a CVD method such as PECVD and LPCVD, crystallizing the amorphous silicon into a polycrystalline layer using a crystallization method, and patterning using a mask. In this case, when the PECVD method is employed for the amorphous silicon, processes of depositing and dehydrating a silicon layer to decrease a concentration of hydrogen are carried out. In addition, the method of crystallizing the amorphous silicon layer may employ a rapid thermal annealing (RTA) method, a solid phase crystallization (SPC) method, an excimer laser crystallization (ELA) method, a metal induced crystallization (MIC) method, a metal induced lateral crystallization (MILC) method, and/or a sequential lateral solidification (SLS) method.

Subsequently, a gate insulating layer 467 is formed on the entire surface of the substrate including the semiconductor layer 370. The gate insulating layer 467 may be formed of a silicon oxide layer, a silicon nitride layer, or a stacked layer thereof, and is deposited by a PECVD or LPCVD method.

A gate electrode 380 corresponding to a predetermined region of the semiconductor layer 370 is formed on the gate insulating layer 467. The gate electrode 380 may be formed of a polysilicon layer made of amorphous silicon or polycrystalline silicon, or formed of molybdenum (Mo), tungsten (W), tungsten molybdenum (MoW), tungsten silicide (WSi$_2$), molybdenum silicide (MoSi$_2$), and/or aluminum (Al). In one embodiment, the gate electrode 380 is formed of Mo, W, MoW, WSi$_2$, MoSi$_2$, and/or Al, and formed by a sputtering method.

In this case, a scan line (not shown) is simultaneously formed of the same material as the gate electrode on the same layer as the gate electrode 380 when the gate electrode 380 is formed in the metal line region c.

Subsequently, impurities are injected into the semiconductor layer 370 using a mask to form source and drain regions 370*a* and 370*c* in the semiconductor layer 370 while a channel region 370*b* interposed between the source and drain regions 370*a* and 370*c* is defined. The impurities may be N types or P types, and the N type impurities may be phophor (P), arsenic (As), antimony (Sb), and/or bismuth (Bi), and the P type impurities may be boron (B), aluminum (Al), gallium (Ga), and/or indium (In).

Subsequently, an interlayer-insulating layer 483 is formed on the entire surface of the substrate including the gate electrode 380. The interlayer-insulating layer 483 may be formed of a silicon oxide layer, a silicon nitride layer, or a stacked layer thereof, and is deposited by a method such as PECVD and LPCVD.

Contact holes 385 are formed within the interlayer-insulating layer 483 to expose the source and drain regions 370*a* and 370*c*, respectively. A metal layer is deposited on the source and drain regions 370*a* and 370*c* exposed within the contact holes 385 and the interlayer-insulating layer 483, which is patterned to form source and drain electrodes 390*a* and 390*b*.

When the source and drain electrodes 390*a* and 390*b* are formed, source and drain electrode materials are deposited on the metal line region c and patterned to form the data line 320 and the common power supply line 330 at the same time.

Accordingly, the semiconductor layer 370, the gate electrode 380, and the source and drain electrodes 390*a* and 390*b* constitute a thin film transistor.

A passivation layer 491 is formed on the source and drain electrodes 390*a* and 390*b* of the transistor region b and on the entire surface of the substrate so that the thin film transistor is protected from contaminants during subsequent processes. The passivation layer 491 may be formed of a silicon oxide layer, a silicon nitride layer, or a stacked layer thereof. In one embodiment, it is deposited by a method such as PECVD or LPCVD.

A first electrode 300 is formed on the passivation layer 491 including a via hole 395 formed by etching so that the first electrode 300 is in contact with one electrode of the source and drain electrodes 390*a* and 390*b*. The first electrode 300 may be formed of an Indium Tin Oxide (ITO) or an Indium Zinc Oxide (IZO), and is formed of ITO in the described embodiment.

In this case, the portion of the first electrode 300 formed on the opening region a overlaps at least one of the data line 320 and the common power supply line 330 of the metal line region c so that a dead space d3' is reduced and a wide opening e is formed in a subsequent process.

A region d4 where the first electrode 300 overlaps the data line 320 or the common power supply line 330 is in a range of 3 μm to 10 μm.

When the overlapping region is not more than 3 μm, the dead space cannot be reduced, and when the overlapping region is not less than 10 μm, the first electrode 300 may extend past the data line 320 or the common power supply line 330 so that it may be out of the unit pixel region to make a bridge with adjacent pixels.

Typically, the first electrode 300 is formed and patterned by a sputtering method.

Subsequently, a pixel defining layer (PDL) 311 is formed of a photosensitive organic insulating material on the entire surface of the substrate to define the opening portion e and to insulate between the organic emission layers. The photosensitive organic insulating layer is a positive type so that it is dissolved in a development solution when exposed to light. In addition, the photosensitive organic insulating layer has good planarization characteristics so that it can relieve the topology of the passivation insulating layer 491 to have a planarized surface. The pixel defining layer 311 composed of the photosensitive organic insulating layer may be formed of acrylic resin or polyimide (PI). In addition, the pixel defining layer 311 may be formed on the substrate by a spin coating technique.

Subsequently, backside exposure is carried out to etch the pixel defining layer 311 so that the opening portion e exposing the first electrode 300 of the opening region a is formed.

The backside exposure irradiates light toward a bottom surface of the substrate 462 where the pixel defining layer 311 is to define an opening portion e exposing the first electrode 300 in the opening region a. The first electrode 300 transmits light incident upon the bottom surface of the substrate 462. Accordingly, the pixel defining layer 311 formed on the first electrode 300 is exposed to light. The region where the pixel defining layer 311 including the photosensitive organic insulating layer is exposed to light, i.e., the opening portion e, is transformed to a material soluble in a development solution so that it is etched.

The semiconductor layer 370, the gate electrode 380, a scan line, the source and drain electrodes 390a and 390b, the data line 320, and the common power supply line 330 are arranged on the transistor region b and the metal line region c of the substrate, and the semiconductor layer 370 is formed of silicon whereas the gate electrode 380, the scan line (not shown), the source and drain electrodes 390a and 390b, and the data lines and the common power supply lines 320 and 330 are formed of metal so that light cannot be transmitted. Accordingly, the pixel defining layer 311 formed on the passivation layer 491 of the transistor region b and the metal line region c is not exposed to light incident upon the bottom surface of the substrate 462.

Consequently, the region where the pixel defining layer 311 is exposed to light, i.e., the region on the first electrode 300, is transformed to a material soluble in a development solution, whereas the pixel defining layer 311 on the transistor region b and the metal line region c is not transformed.

By making the first electrode 300 overlap the data line 320 or the common power supply line 330 by a span d4 and etching the pixel defining layer 311 using a backside exposure, the reduced dead space d3' can be secured. In addition, the reduced number of process masks allows a process tact time to be reduced, so that the fabrication cost can be saved.

In the OLED according to the embodiment of the present invention, referring to FIG. 3, when the pixel defining layer 311 is etched by the backside exposure, d1' increases by 3 μm in each of right and left directions and d2' increases by 3 μm downward so that d1' and d2' of the OLED become 47 μm and 137 μm, respectively, and the aperture ratio defined by d1'×d2' becomes 6,439 μm² which is equal to 47 μm×137 μm. d2' can increase to greater than 137 μm by making the scan line 310 overlap the first electrode 300 and carrying out the backside exposure on the pixel defining layer 310.

In accordance with one embodiment of the present invention, the first electrode 100 overlaps the scan line 310, the data line 320, and the common power supply line 330 and the backside exposure is carried out on the pixel defining layer 311, so that the pixel defining layer 311 is etched except the regions where the transistors 340 and 350, the capacitor 360, the scan line 310, the data line 320, and the common power supply line 330 are formed, which thus allows an emission region to increase to have an aperture ratio greater than 6,439 μm².

As such, the aperture ratio according to the present invention increases compared to conventional 5,494 μm², such that the aperture ratio increases by 17% or more compared to the conventional aperture ratio.

However, the present invention is not limited to making the first electrode 300 overlap the scan line 310, the data line 320 and the common power supply line 330, but may be applied to make the first electrode 300 overlap the scan line 310, the data line 320 and/or the common power supply line 330 such that the opening may be enlarged.

Figure 5:
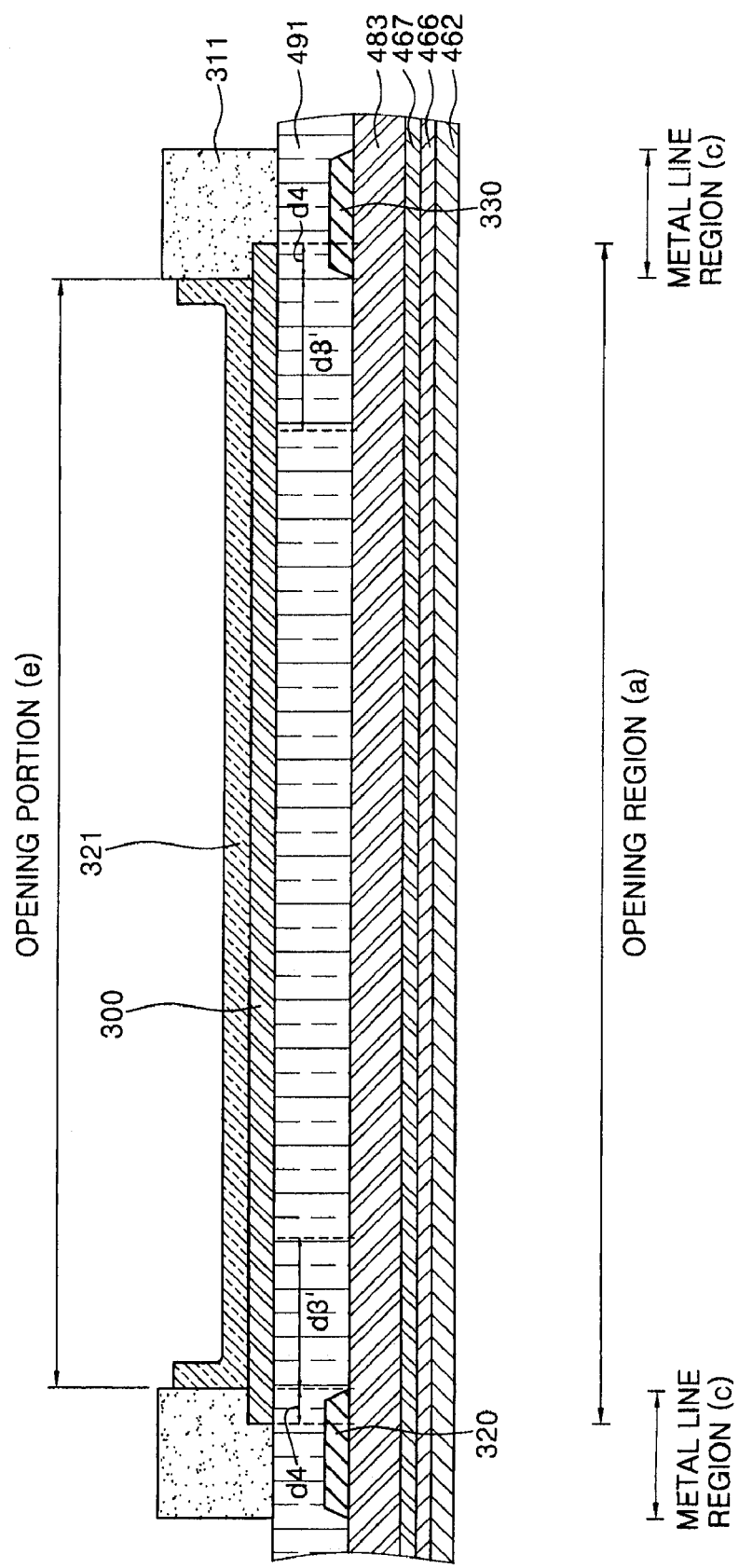
FIG. 5 is a cross-sectional view taken along a line C-C' of FIG. 3 in the active matrix OLED of the present invention.

FIG. 5 is a cross-sectional view taken along a line C-C' of FIG. 3 in the active matrix OLED display of the present invention. It can be seen from the cross-sectional view that the first electrode 300 overlaps each of the data line 320 and the common power supply line 330 of the metal line regions c on both sides of the opening region a by a span d4 so that dead space is removed and the opening region is enlarged. In this case, the pixel defining layer 311 is etched by backside exposure to enlarge the opening portion e. In this case, the opening portion e is enlarged by making the first electrode 300 overlap the data line 320 or the common power supply line 330, and carrying out the backside exposure on the pixel defining layer 311 over the region d3', which adds 3 μm to the opening portion e toward the data line 320 and the common power supply line 330, so that the total enlargement of the opening portion e becomes 6 μm.

Subsequently, an organic layer 321 including at least an organic emission layer (EML) is formed on the first electrode 100 exposed within the opening e. The organic layer 120 may further include at least one layer among an electron injecting layer (EIL), an electron transporting layer (ETL), a hole transporting layer (HTL), and a hole injecting layer (HIL) in addition to the organic emission layer EML. One of a small molecular material and a polymer material may be used to form the organic emission layer, and the small molecular material is formed of an aluminum quinoline complex (Alq3), anthracene, cyclopentadiene, Almq, ZnPBO, Balq, and/or DPVBi. The polymer material is formed of polythiophene (PT), poly(p-phenylenevinylene) (PPV), polyphenylene (PPV), and/or a derivative thereof.

The organic layer 321 is deposited by a vacuum deposition method, a spin coating technique, an ink-jet printing method, a laser induced thermal imaging (LITI) method, or so forth. In one embodiment, it is deposited by the spin coating technique. In addition, the organic layer may be patterned by a vacuum deposition method using a shadow mask, an LITI method, or similar method.

Subsequently, a second electrode (not shown) is formed on the organic layer 321 over the surface of the substrate. The second electrode (not shown) is formed of one selected from a group consisting of Mg, CA, Al, Ag, and/or an alloy thereof using a vacuum deposition method.

The substrate including the second electrode is encapsulated with an upper substrate by a typical method to complete the fabrication of the OLED.

In the presented embodiments of the present invention, the OLED has been described for sake of simplicity as having a first electrode that overlaps the data line formed of the same materials as the source and drain and the common power supply line, and then overlaps the scan line formed of the same material as the gate electrode, and the use of a backside exposure on the pixel defining layer to increase the aperture ratio, however, the present invention is not limited thereto.

According to the present invention as described above, the first electrode can be formed to overlap the scan line, the common power supply line and/or the data line in the OLED, and the pixel defining layer can be etched by backside exposure, so that the aperture ratio can be enhanced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an organic light emitting diode (OLED) display, the method comprising:
   providing a substrate;
   forming a thin film transistor including a semiconductor layer, a gate electrode, a source electrode and a drain electrode on a transistor region of the substrate;
   forming a scan line when forming the gate electrode on a metal line region of the substrate;
   forming a common power supply line and a data line when forming the source electrode and the drain electrode;
   forming a passivation layer over an entire surface of the substrate including the thin film transistor;
   forming a first electrode to overlap the scan line, the common power supply line and/or the data line;

forming a pixel defining layer on at least the first electrode,
creating an opening portion in the pixel defining layer using a backside exposure technique to expose a portion of a surface of the first electrode,
wherein a width between parallel and facing edges of the opening portion corresponds to a distance between facing edges of the common power supply line and the data line, and
wherein at least one of the scan line, the data line, or the common power supply line is configured to define a portion of a mask for forming the opening portion;
forming an organic layer including at least an organic emission layer on the portion of the surface of the first electrode; and
forming a second electrode on the organic layer.

2. The method of claim 1, wherein the first electrode overlaps by 3 μm to 10 μm the scan line, the common power supply line, and/or the data line.

3. The method of claim 2, wherein the scan line is formed of molybdenum (Mo), tungsten (W), tungsten molybdenum (MoW), tungsten silicide (WSi2), molybdenum silicide (MoSi2), and/or aluminum (Al).

4. The method of claim 2, wherein the common power supply line and the data line are formed of molybdenum (Mo), tungsten (W), tungsten molybdenum (MoW), tungsten silicide (WSi2), molybdenum silicide (MoSi2), and/or aluminum (Al).

5. The method of claim 2, wherein the first electrode is formed of Indium Tin Oxide (ITO) and/or Indium Zinc Oxide (IZO).

6. The method of claim 1, wherein the pixel defining layer is formed of a photosensitive insulating layer.

7. The method of claim 6, wherein the pixel defining layer is formed of acrylic resin and/or polyimide.

8. The method of claim 6, wherein the pixel defining layer is formed by a spin coating technique.

9. The method of claim 1, wherein the first electrode is an anode or a cathode.

10. A method of fabricating an organic light emitting diode (OLED) display, the method comprising:
providing a substrate;
forming a thin film transistor including a semiconductor layer, a gate electrode, a source electrode and a drain electrode on a transistor region of the substrate;
forming a scan line when forming the gate electrode on a metal line region of the substrate;
forming a common power supply line and a data line when forming the source electrode and the drain electrode;
forming a passivation layer over an entire surface of the substrate including the thin film transistor;
forming a first electrode to overlap the scan line, the common power supply line and/or the data line;
forming a pixel defining layer on at least the first electrode,
creating an opening portion in the pixel defining layer using a backside exposure technique to expose a portion of a surface of the first electrode, wherein a width between parallel and facing edges of the opening portion corresponds to a distance between facing edges of the common power supply line and the data line;
forming an organic layer including at least an organic emission layer on the portion of the surface of the first electrode; and
forming a second electrode on the organic layer.

11. A method of fabricating an organic light emitting diode (OLED) display, the method comprising:
providing a substrate;
forming a thin film transistor including a semiconductor layer, a gate electrode, a source electrode and a drain electrode on a transistor region of the substrate;
forming a scan line when forming the gate electrode on a metal line region of the substrate;
forming a common power supply line and a data line when forming the source electrode and the drain electrode;
forming a passivation layer over an entire surface of the substrate including the thin film transistor;
forming a first electrode to overlap the scan line, the common power supply line, and/or the data line;
forming a pixel defining layer on at least the first electrode,
creating an opening portion in the pixel defining layer using a backside exposure technique to expose a portion of a surface of the first electrode, wherein at least one of the scan line, the data line, or the common power supply line is configured to define a portion of a mask for forming the opening portion;
forming an organic layer including at least an organic emission layer on the portion of the surface of the first electrode; and
forming a second electrode on the organic layer.

* * * * *